(12) United States Patent
Matsuoka et al.

(10) Patent No.: US 7,025,650 B2
(45) Date of Patent: Apr. 11, 2006

(54) MANUFACTURING METHOD OF ELECTROLUMINESCENT DISPLAY DEVICE

(75) Inventors: Hideki Matsuoka, Gifu (JP); Kaoru Horiguchi, Ogaki (JP)

(73) Assignee: Sanyo Electric Co., Ltd., Osaka (JP)

( * ) Notice: Subject to any disclaimer, the term of this patent is extended or adjusted under 35 U.S.C. 154(b) by 272 days.

(21) Appl. No.: 10/423,055

(22) Filed: Apr. 25, 2003

(65) Prior Publication Data

US 2004/0023591 A1 Feb. 5, 2004

(30) Foreign Application Priority Data

Apr. 26, 2002 (JP) ............................. 2002-127420

(51) Int. Cl.
*H01J 9/00* (2006.01)
*H01J 9/40* (2006.01)
*H01J 9/24* (2006.01)

(52) U.S. Cl. .......................................... 445/25; 445/24
(58) Field of Classification Search .................. 445/24, 445/25; 313/506, 509, 512
See application file for complete search history.

(56) References Cited

U.S. PATENT DOCUMENTS

| 5,568,297 A | * | 10/1996 | Tsubota et al. ................ 445/25 |
| 6,211,938 B1 | * | 4/2001 | Mori ........................... 349/190 |
| 6,290,793 B1 | * | 9/2001 | Lovas et al. ................... 156/99 |
| 2002/0155320 A1 | * | 10/2002 | Park et al. .................... 313/512 |

FOREIGN PATENT DOCUMENTS

| JP | 04147217 A | * | 5/1992 |
| JP | 2000164354 A | * | 6/2000 |

* cited by examiner

*Primary Examiner*—Mariceli Santiago
(74) *Attorney, Agent, or Firm*—Morrison & Foerster LLP

(57) ABSTRACT

In a sealing structure of an EL element of the invention, there are inhibited a fluctuation of a width of sealing resin, infiltration of moisture in a portion formed with an organic EL element and breaking of a device substrate formed with the EL element. In this structure, a sealing glass substrate is mounted on a quartz plate, and a device glass substrate is absorbed by an absorbing plate. The organic EL display unit formed on a main surface of the device glass substrate and a desiccant layer formed on a main surface of the sealing glass substrate are disposed facing to each other. There is provided on a main surface of the absorbing plate a convex portion for applying a load by the absorbing plate to the sealing resin. The load is applied by the absorbing plate until a gap between the device glass substrate and the sealing glass substrate becomes a predetermined gap.

8 Claims, 5 Drawing Sheets

MANUFACTURING METHOD OF ELECTROLUMINESCENT DISPLAY DEVICE

BACKGROUND OF THE INVENTION

1. Field of the Invention

This invention relates to a manufacturing method of an electroluminescent display device, particularly to a method of sealing an electroluminescent display device including a first substrate having an electroluminescent element thereon and a second substrate for sealing the first substrate.

2. Description of the Related Art

In recent years, electroluminescent (hereafter, referred to as EL) display devices with EL elements have been receiving an attention as a display device replacing a CRT and an LCD.

In a conventional organic EL display panel, a plurality of pixels each having an organic EL element and TFTs for driving the organic EL element is disposed in a matrix on a device glass substrate to form a display region. Since the organic EL element has a characteristic of being sensitive to moisture, there is proposed a sealing structure in which moisture infiltration is prevented by covering the glass substrate with a metal cap or a sealing glass substrate which is coated with a desiccant.

In a sealing structure with the sealing glass substrate, the device glass substrate having the organic EL element and the sealing glass substrate are attached with a sealing resin by applying a load with a flat plate.

With size increase in the device glass substrate, however, it becomes difficult to apply the load uniformly to the device glass substrate having a large area. In some case, a cushion is used to distribute the load evenly. Therefore, there arises a variety of problems in the attaching process. For example, a fluctuation of a width of the sealing resin occurs, which results in a formation of a narrow portion of the sealing resin or a large gap between the device glass substrate and the sealing glass substrate, thereby allowing moisture to infiltrate through such a portion.

Furthermore, in the attaching process, a load is applied to the device glass substrate to provide a predetermined gap between the device glass substrate and the sealing glass substrate. The applied load causes a flexure in the device glass substrate, which in some case results in breaking the device glass substrate.

SUMMARY OF THE INVENTION

The invention provides a manufacturing method of an electroluminescent display device. The method includes providing a first substrate having an electroluminescent display unit thereon, providing a second substrate, and detachably attaching the first substrate to a mounting plate so that the first substrate is supported by a convex portion formed on a surface of the mounting plate. The method also includes placing the first substrate attached to the mounting plate over the second substrate so that a sealing resin layer is interposed between the first and second substrates, and applying a pressure to the sealing resin layer through the convex portion of the mounting plate by applying a load to the mounting plate.

The invention also provides a manufacturing method of an electroluminescent display device. The method includes providing a first substrate having an electroluminescent display unit thereon, providing a second substrate having a desiccant layer thereon, and detachably attaching the first substrate to a first mounting plate so that the first substrate is supported by a convex portion formed on a surface of the first mounting plate. The method also includes detachably attaching the second substrate to a second mounting plate, placing the first the mounting plate over the second mounting plate so that a sealing resin layer is interposed between the first and second substrates and that the electroluminescent display unit faces the desiccant layer, and applying a pressure to the sealing resin layer through the convex portion of the first mounting plate by applying a load to the first mounting plate.

DETAILED DESCRIPTION OF THE INVENTION

There will be described an embodiment of the invention with reference to the above drawings in detail. First, a device glass substrate having organic EL elements and a sealing substrate for sealing the device glass substrate will be described.

Figure 1:
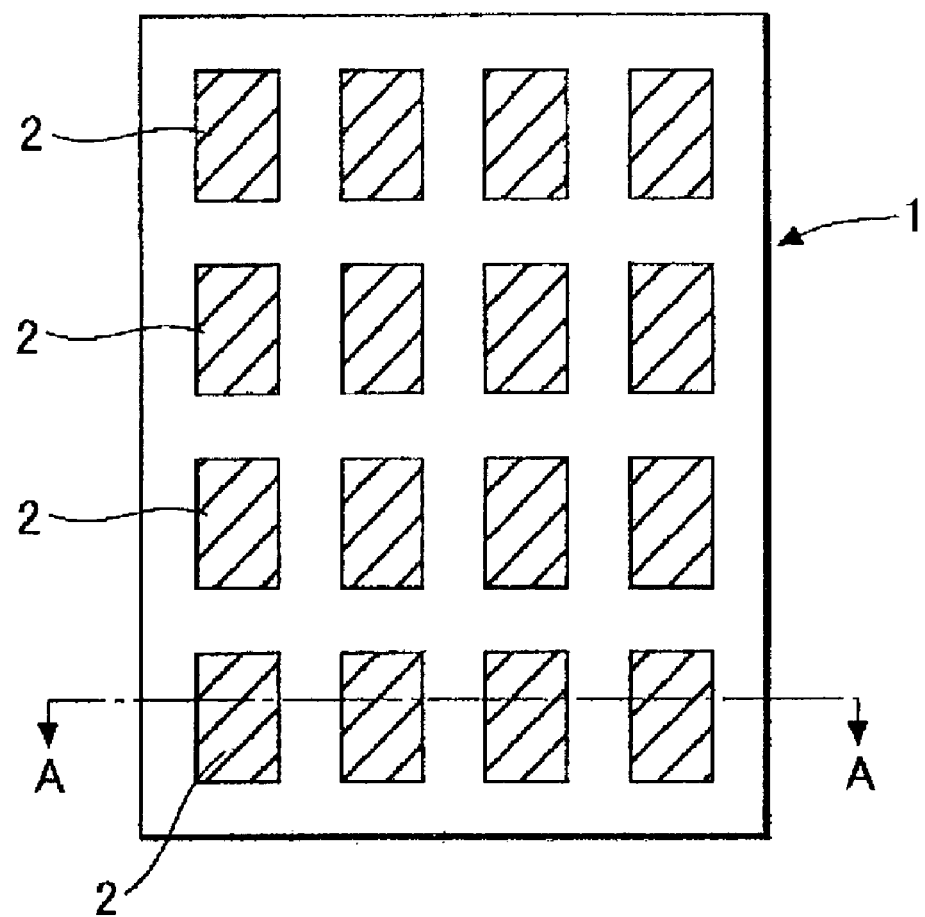
FIG. 1 is a plan view of a device glass substrate according to an embodiment of the invention.

FIG. 1 is a plan view of a device glass substrate 1. On a main surface of the device glass substrate 1, or a mother glass substrate, a plurality of an organic EL display unit 2 is disposed in a matrix at predetermined intervals. Each of the organic EL display units 2 has a plurality of pixels each having an organic EL element and organic EL element driving TFTs, and serves as an organic EL panel.

Figure 2:
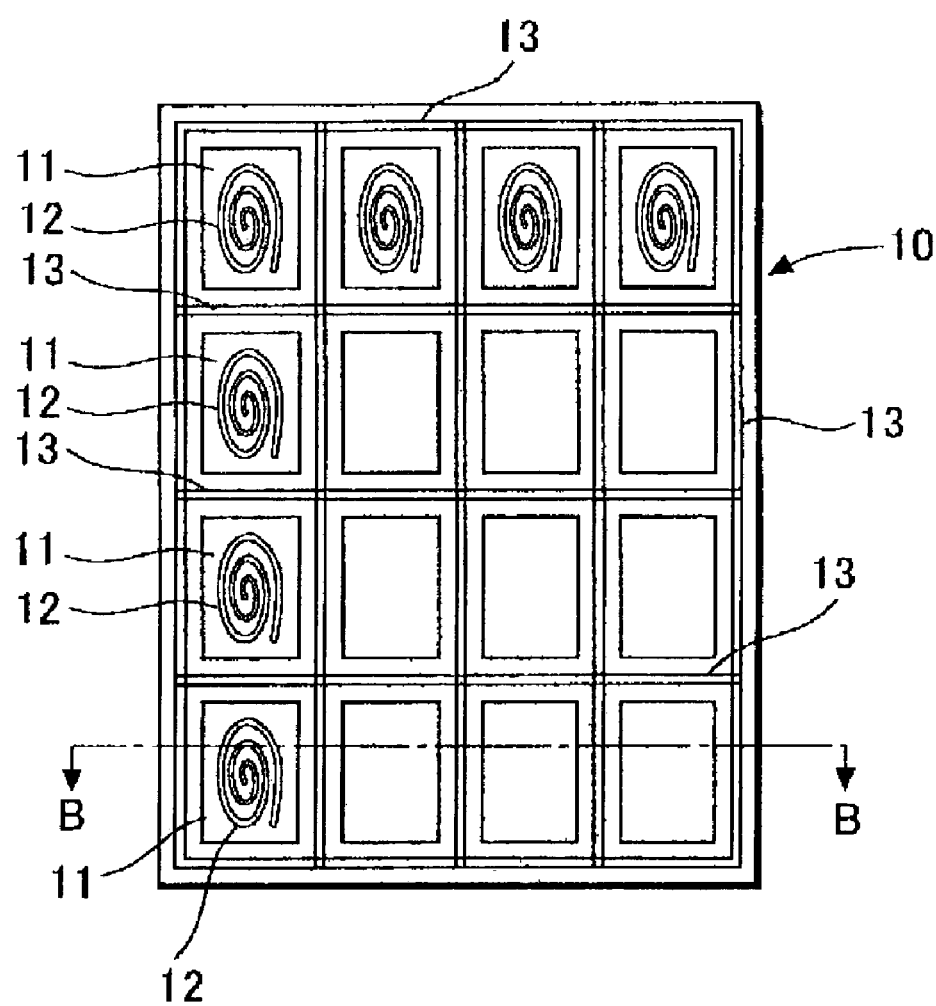
FIG. 2 is a plan view of a sealing glass substrate according to the embodiment of the invention.

FIG. 2 is a plan view of a sealing glass substrate 10. On a main surface of the sealing glass substrate 10, a plurality of concave portions 11 (hereafter, referred to as a pocket portion 11) is formed at locations corresponding to the organic EL display unit 2. The pocket portion 11 is larger than the organic EL display unit 2. The pocket portion 11 is formed, for example, by etching the main surface of the sealing glass substrate 10.

A desiccant layer 12 for absorbing moisture is placed on a bottom of the pocket portion 11. The desiccant layer 12 is formed, for example, by coating a solvent dissolved with powdered calcium oxide or barium oxide and a resin as an adhesive on the bottom of the pocket portion 11 and then hardening the solvent by UV irradiation or heating.

Although the desiccant layer 12 preferably has a spiral shape for increasing a surface area thereof, it may be of an arbitrary shape. Placing the desiccant layer 12 in the pocket portion 11 secures a large gap between the desiccant layer 12 and the organic EL element so that the desiccant layer 12 does not contact the organic EL element. Such a contact would result in damaging the organic EL element.

Furthermore, a sealing resin 13 made of epoxy resin etc is coated on a periphery of the pocket portion 11 on the sealing glass substrate 10. This sealing resin 13 can be formed on the device glass substrate 1, rather than on the sealing glass substrate 10.

Figure 3:
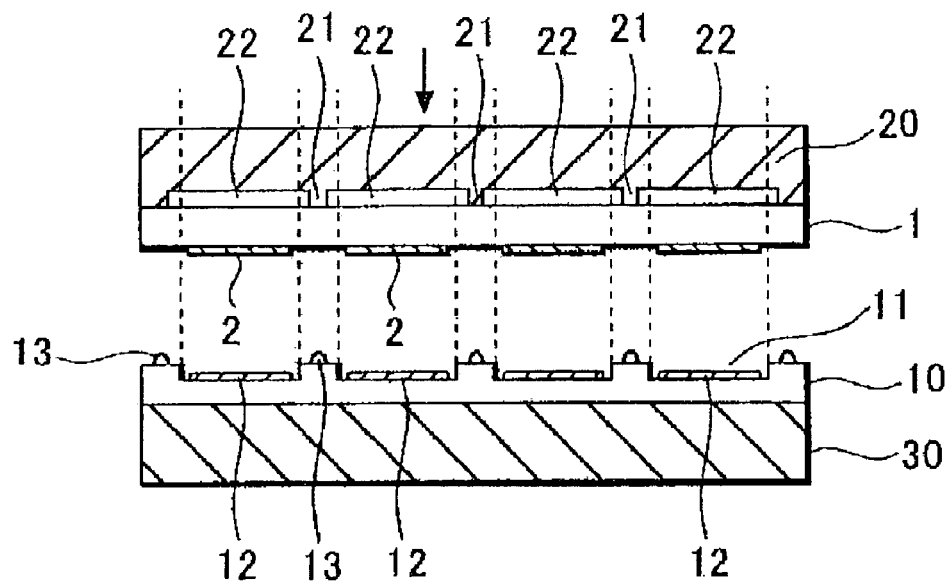
FIG. 3 shows the positioning of the device glass substrate and the sealing glass substrate prior to the attaching of the two substrates.
Figure 4:
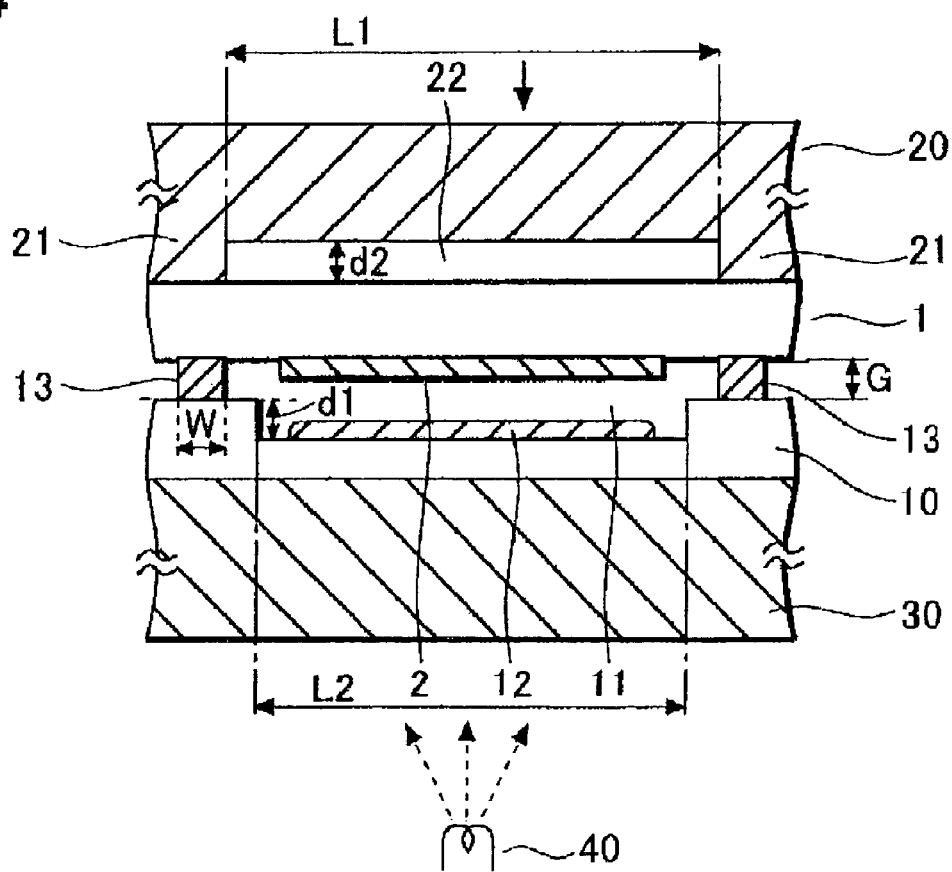
FIG. 4 is a partial cross-sectional view of the attached device glass substrate and sealing glass substrate.

Next, there will be described a process of attaching the device glass substrate 1 to the sealing glass substrate 10 with reference to FIGS. 3 and 4. FIG. 3 is a cross-sectional view of the two substrates just before the device glass substrate 1 and the sealing glass substrate 10 are attached. FIG. 4 is a partial cross-sectional view of the attached device glass substrate 1 and sealing glass substrate 10, showing a portion to become an organic EL panel.

The following attaching process steps are carried out in inert gas atmosphere such as $N_2$ gas atmosphere. As shown in FIG. 3, the sealing glass substrate 10 is mounted on a quartz plate 30, whereas the device glass substrate 1 is attached to an absorbing plate 20 made of metal by vacuum suction, which is disposed above the quartz plate 30. The organic EL display unit 2 formed on the main surface of the device glass substrate 1 faces the desiccant layer 12 formed on the main surface of the sealing glass substrate 10.

There is provided on a main surface of the absorbing plate 20 a convex portion 21 for applying a load by the absorbing plate 20 to the sealing resin 13. A concave portion 22 is provided on the main surface of the absorbing plate 20, corresponding to the pocket portion 11. This concave portion 22 is formed larger than the pocket portion 11.

The absorbing plate 20 is slid down by a moving mechanism (not shown). As shown in FIG. 4, a load is applied by the absorbing plate 20 until a gap between the device glass substrate 1 and the sealing glass substrate 10 becomes a predetermined gap G.

Since the concave portion 22 is provided on the main surface of the absorbing plate 20, the load by the absorbing plate 20 is applied uniformly to the sealing resin 13 through the convex portion 21. Thus, a variation of the width W of the sealing resin 13 is prevented. Accordingly, moisture does not infiltrate through the portions where the width W of the sealing resin 13 is small.

Furthermore, since the concave portion 22 is provided on the main surface of the absorbing plate 20, the load is not applied to the portion of the device glass substrate 1 corresponding to the concave portion 22, thereby preventing a flexure and breaking of this portion of the device glass substrate 1. If the concave portion 22 is not provided, the flexure occurs in the device glass substrate 1. Furthermore, without the concave portion 22, the pocket portion 11 makes the flexure larger, which results in cracking and breaking of the device glass substrate 1.

The width L1 of the concave portion 22 is preferably larger than the width L2 of the pocket portion 11. This is for avoiding application of the load to the device glass substrate 1 above the pocket portion 11.

Then, the sealing resin 13 is hardened by UV irradiation thereto through the quartz plate 30 and the sealing glass substrate 10 from a UV irradiator 40 placed near the back side of the quartz plate 30. This completes the attachment of the device glass substrate 1 to the sealing glass substrate 10.

Preferably, the thickness for each of the device glass substrate 1 and the sealing glass substrate 10 is about 0.7 mm. The depth d1 of the pocket portion 11 is about 0.3 mm. The gap G is 10 to 20 micrometers. The depth d2 (a height of the convex portion 22) of the concave portion 22 is 0.5 to 1 mm.

The device glass substrate 1 and the sealing glass substrate 10 thus attached prevents the penetration of moisture into the EL display device from outside.

After that step, the device glass substrate 1 and sealing glass substrate 10 attached together are cut off into individual organic EL display devices. This completes the manufacturing of the organic EL display device.

It is noted that the portion applying a pressure to the sealing resin 13, i.e., the convex portion 21, is smaller in surface area in comparison to the entire area of absorbing plate 20, and thus the total load applied to the absorbing plate 20 may be smaller and still able to press the sealing resin 13 effectively.

Figure 5:
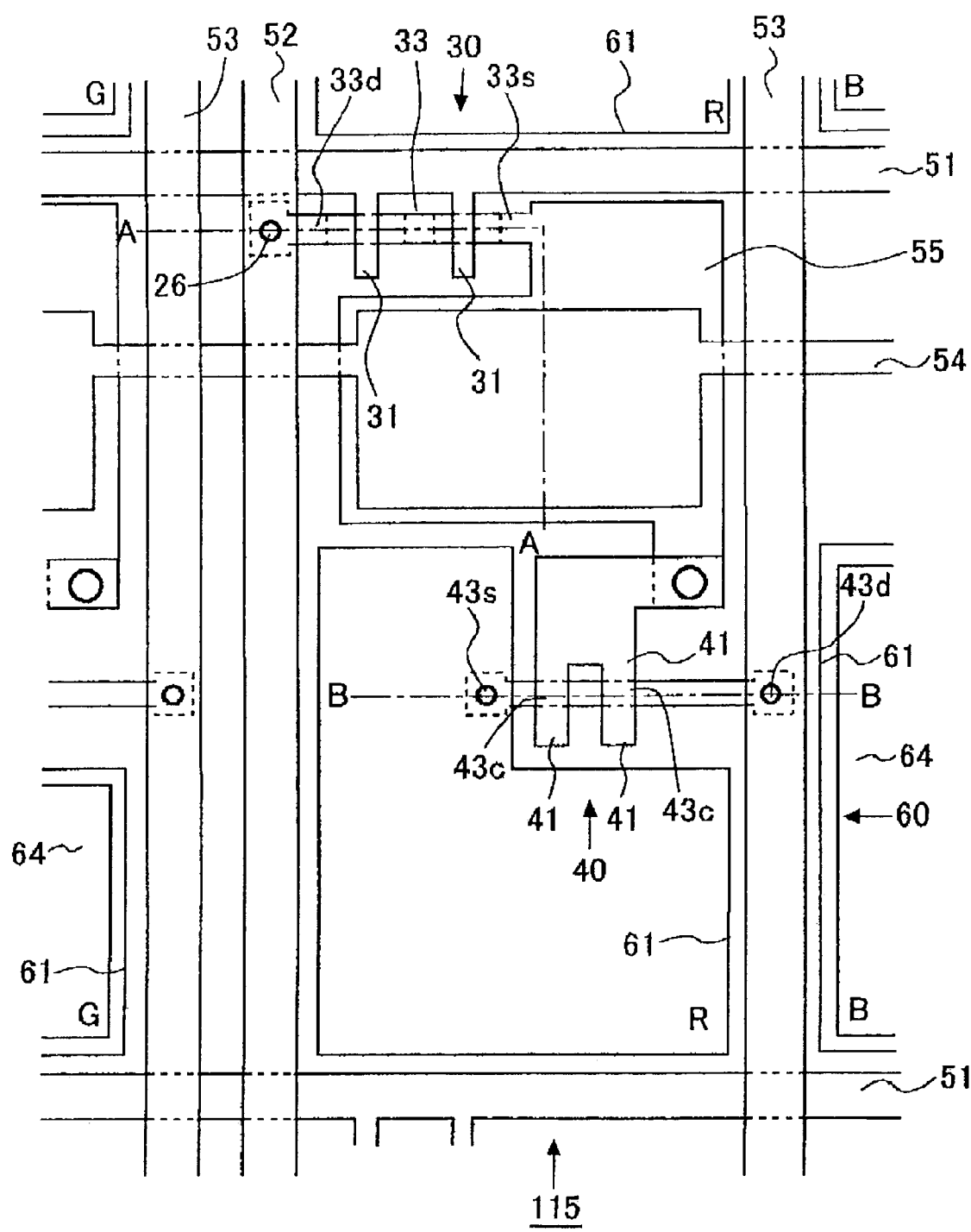
FIG. 5 is a plan view of a pixel of an organic EL display device of the embodiment.
Figure 6A:
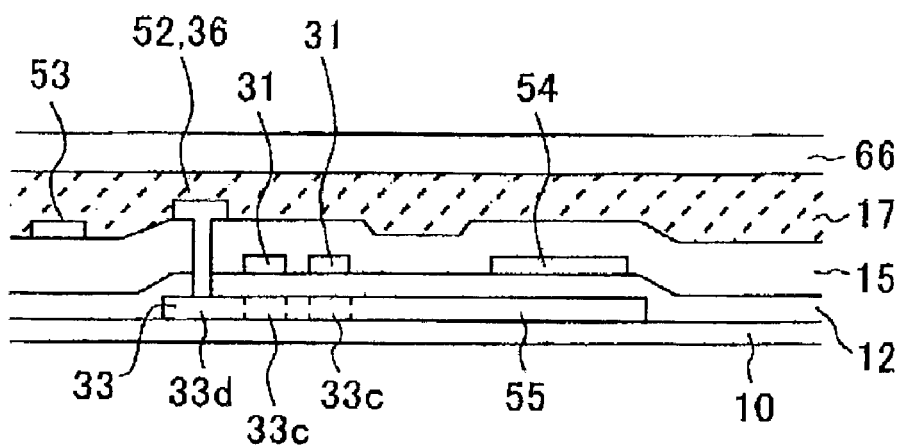
FIGS. 6A and 6B are cross-sectional views of the pixel of the organic EL display device of FIG. 5.
Figure 6B:
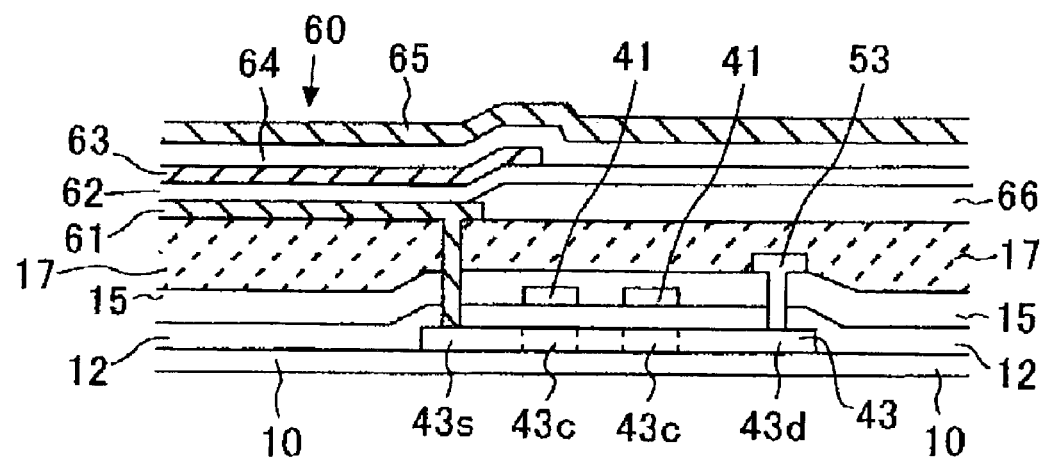

Next, there will be described an example of a structure of the pixel of the organic EL display unit 2 of this invention. FIG. 5 is a plan view of the pixel of the organic EL display unit 2. FIG. 6A is a cross-sectional view along line A—A of FIG. 5 and FIG. 6B is a cross-sectional view along line B—B of FIG. 5.

As shown in FIG. 5, a pixel 115 is formed in a region enclosed with a gate signal line 51 and a drain signal line 52. A plurality of the pixels 115 is disposed in a matrix.

There are disposed in the pixel 115 an organic EL element 60 as a self-emission element, a switching TFT (thin film transistor) 30 for controlling a timing of supplying an electric current to the organic EL element 60, a driving TFT 40 for supplying an electric current to the organic EL element 60 and a storage capacitor. The organic EL element 60 includes an anode 61, an emissive layer made of an emission material and a cathode 65.

The switching TFT 30 is provided in a periphery of a point of intersection of both signal lines 51 and 52. A source 33s of the switching TFT 30 serves as a capacitor electrode 55 for forming a capacitor with a storage capacitor electrode line 54 and is connected to a gate electrode 41 of the driving TFT 40. A source 43s of the driving TFT 40 is connected to the anode 61 of the organic EL element 60, while a drain 43d is connected to a driving source line 53 as a current source to be supplied to the organic EL element 60.

The storage capacitor electrode line 54 is disposed in parallel with the gate signal line 51. The storage capacitor electrode line 54 is made of Cr (chromium) and forms a capacitor by storing electric charges with the capacitor electrode 55 connected to the source 33s of the TFT through a gate insulating film 12. A storage capacitor 56 is provided for storing voltage applied to the gate electrode 41 of the driving TFT 40.

As shown in FIGS. 6A and 6B, the organic EL display device is formed by laminating the TFTs and the organic EL element sequentially on a substrate 10 such as a substrate made of a glass a synthetic resin, a conductive material or a semiconductor. When using a conductive substrate or a semiconductor substrate as the substrate 10, however, an insulating film such as $SiO_2$ or $SiN_x$ is formed on the substrate 10, and then the switching TFT 30, the driving TFT 40 and the organic EL element 60 are formed thereon. Each of the both TFTs has a so-called top gate structure in which a gate electrode is disposed above an active layer with a gate insulating film being interposed therebetween.

There will be described the switching TFT 30 first. As shown in FIG. 6A, an amorphous silicon film (hereafter, referred to as an a-Si film) is formed on the insulating substrate 10 made of a silica glass or a non-alkali glass by a CVD method. The a-Si film is irradiated by laser beams for melting and recrystalizing to form a poly-silicon film (hereafter, referred to as a p-Si film) as an active layer 33. On the active layer 33, a single-layer or a multi-layer of an $SiO_2$ film and an $SiN_x$ film is formed as the gate insulating film 12. There are disposed on the gate insulating film 12 the gate signal line 51 made of metal having a high melting point such as Cr and Mo (molybdenum) and also serving as a gate electrode 31, the drain signal line 52 made of Al (aluminum), and the driving source line 53 made of Al and serving as a driving source of the organic EL element.

An interlayer insulating film 15 laminated with an $SiO_2$ film, an $SiN_x$ film and an $SiO_2$ film sequentially is formed on the whole surfaces of the gate insulating film 12 and the active layer 33. There is provided a drain electrode 36 by filling a contact hole provided correspondingly to a drain 33d with a metal such as Ai. Furthermore, a planarization insulation film 17 for planarizing the surface which is made of an organic resin is formed on a whole surface.

Next, there will be described the driving TFT 40 of the organic EL element. As shown in FIG. 6B, an active layer 43 formed by poly-crystalizing an a-Si film by irradiating laser beams thereto, the gate insulating film 12, and the gate electrode 41 made of metal having a high melting point such as Cr and Mo are formed sequentially on the insulating substrate 10. There are provided in the active layer 43a channel 43c, and a source 43s and a drain 43d on both sides of the channel 43c. The interlayer insulating film 15 laminated with an $SiO_2$ film, an $SiN_x$ film and an $SiO_2$ film sequentially is formed on the whole surfaces of the gate insulating film 12 and the active layer 43. There is disposed the driving source line 53 connected to a driving source by filling a contact hole provided correspondingly to a drain 43d with a metal such as Al. Furthermore, a planarization insulation film 17 for planarizing the surface, which is made of, for example, an organic resin is formed on the whole surface. A contact hole is formed in a position corresponding to a source 43s in the planarization insulation film 17. There is formed on the planarization insulation film 17 a transparent electrode made of ITO (Indium Tin Oxide) and contacting to the source 43s through the contact hole, i.e., the anode 61 of the organic EL element. The anode 61 is formed in each of the pixels, being isolated as an island.

The organic EL element 60 has a structure of laminating sequentially the anode 61 made of a transparent electrode such as ITO, a hole transport layer 62 including a first hole transport layer made of MTDATA (4,4-bis(3-methylphenylphenylamino) biphenyl), and a second hole transport layer made of TPD (4,4,4-tris(3-methylphenylphenylamino) triphenylanine), an emissive layer 63 made of $Bebq_2$ (bis (10-hydroxybenzo[h]quinolinato)beryllium) containing a quinacridone derivative, an electron transport layer 64 made of $Bebq_2$, and a cathode 65 made of magnesium-indium alloy, aluminum or aluminum alloy.

A second planarization insulation film 66 is formed on the planarization insulation film 17. The second planarization insulation film 66 is removed on the anode 61.

In the organic EL element 60, a hole injected from the anode 61 and an electron injected from the cathode 65 are recombined in the emissive layer and an exciton is formed by exciting an organic module forming the emissive layer 63. Light is emitted from the emissive layer 63 in a process of radiation of the exciton and then released outside after going through the transparent anode 61 and the transparent insulating substrate 10, thereby to complete light-emission.

What is claimed is:

1. A manufacturing method of an electroluminescent display device, comprising:
   providing a first substrate having an electroluminescent display unit thereon;
   providing a second substrate comprising a pocket portion;
   detachably attaching the first substrate to a mounting plate so that the first substrate is supported by a convex portion formed on a surface of the mounting plate so as to surround substantially an area of the first substrate corresponding to the electroluminescent display unit when the first substrate is attached to the mounting plate;
   placing the first substrate attached to the mounting plate over the second substrate so that a sealing resin layer is interposed between the first and second substrates and the pocket portion faces the electroluminescent display unit; and
   applying a pressure to the sealing resin layer through the convex portion of the mounting plate by applying a load to the mounting plate,
   wherein the pocket portion is smaller than an area surrounded by the convex portion.

2. The manufacturing method of an electroluminescent display device of claim 1, wherein the attaching of the first substrate to the mounting plate comprises suctioning air between the first substrate and the mounting plate.

3. The manufacturing method of an electroluminescent display device of claim 1, wherein the placing of the first substrate comprises positioning the first and second substrates so that the sealing resin layer is located underneath the convex portion.

4. A manufacturing method of an electroluminescent display device, comprising:
   providing a first substrate having an electroluminescent display unit thereon;
   providing a second substrate comprising a pocket portion in which a desiccant layer is disposed;
   detachably attaching the first substrate to a first mounting plate so that the first substrate is supported by a convex portion formed on a surface of the first mounting plate so as to surround substantially an area of the first substrate corresponding to the electroluminescent display unit when the first substrate is attached to the first mounting plate;
   detachably attaching the second substrate to a second mounting plate;
   placing the first the mounting plate over the second mounting plate so that a sealing resin layer is interposed between the first and second substrates and that the electroluminescent display unit faces the desiccant layer; and
   applying a pressure to the sealing resin layer through the convex portion of the first mounting plate by applying a load to the first mounting plate,
   wherein the pocket portion is smaller than an area surrounded by the convex portion.

5. The manufacturing method of an electroluminescent display device of claim 4, wherein the attaching of the first substrate to the first mounting plate comprises suctioning air between the first substrate and the first mounting plate.

6. The manufacturing method of an electroluminescent display device of claim 4, wherein the placing of the first mounting plate comprises positioning the first and second substrates so that the sealing resin layer is located underneath the convex portion.

7. The manufacturing method of an electroluminescent display device of claim 1, wherein the convex portion surrounds completely the area of the first substrate corresponding to the electroluminescent display unit.

8. The manufacturing method of an electroluminescent display device of claim 4, wherein the convex portion surrounds completely the area of the first substrate corresponding to the electroluminescent display unit.

* * * * *